United States Patent [19]

Smith

[11] Patent Number: 5,334,903
[45] Date of Patent: Aug. 2, 1994

[54] COMPOSITE PIEZOELECTRICS UTILIZING A NEGATIVE POISSON RATIO POLYMER

[75] Inventor: Wallace A. Smith, Vienna, Va.

[73] Assignee: The United States of America as represented by the Secretary of the Navy, Washington, D.C.

[21] Appl. No.: 985,988

[22] Filed: Dec. 4, 1992

[51] Int. Cl.⁵ .................... H01L 41/187; H04R 17/00
[52] U.S. Cl. ..................................... 310/358; 310/800
[58] Field of Search ............... 310/358, 359, 800, 311; 367/157

[56] References Cited

U.S. PATENT DOCUMENTS

| | | | |
|---|---|---|---|
| 4,412,148 | 10/1983 | Klicker et al. | 310/358 |
| 4,422,003 | 12/1983 | Safari et al. | 310/358 |
| 4,613,784 | 9/1986 | Haun et al. | 310/358 |
| 4,683,396 | 7/1987 | Takeuchi et al. | 310/358 |
| 4,728,845 | 3/1988 | Haun et al. | 310/358 |
| 4,755,707 | 7/1988 | Nakaya et al. | 310/357 |
| 4,933,230 | 6/1990 | Card et al. | 310/357 |
| 4,963,782 | 10/1990 | Bui et al. | 310/358 |
| 5,164,920 | 11/1992 | Bast et al. | 367/157 |

OTHER PUBLICATIONS

"Transverse Honeycomb Composite Transducers" by A. Safari et al. Nov. 13, 1982 Penn. State Univ.
T. R. Gururaja, et al. "Piezoelectric Ceramic-Polymer Composites For Transducer Applications" Electric Ceramics, pp. 92–128, 1987.
K. E. Evans, "Tensile Network Microstructures Exhibiting Negative Poisson's Ratio," J. Phys. D:Appl. Phys. 22, 1989.
Ken Evans, "Tailoring the Negative Poisson Ratio", Chemistry & Industry, Oct. 1990.
Wallace A. Smith, The Role of Piezocomposites in Ultrasonic Transducers, Proceedings of IEEE, 1989.

Primary Examiner—Thomas M. Dougherty
Attorney, Agent, or Firm—William F. McCarthy; Thomas E. McDonald; James T. Busch

[57] ABSTRACT

A piezoelectric composite which can be used as a transducer is constructed of parallel piezoelectric ceramic rods set in a passive polymer matrix which has a negative Poisson ratio whereby the electromechanical coupling of the transducer is greatly increased.

7 Claims, 7 Drawing Sheets

COMPOSITE PIEZOELECTRICS UTILIZING A NEGATIVE POISSON RATIO POLYMER

BACKGROUND OF THE INVENTION

Field of the Invention

This invention relates to improved composite piezoelectric materials which find use in ultrasonic applications such as transducers used in naval sonar and in medical ultrasonic imagers. Piezoelectric materials are also used to achieve hydrostatic electromechanical coupling which characteristic can be used in passive hydrophones. In addition, numerous other applications of piezoelectric materials have been developed as electromechanical and electroacoustic transducers.

Although single crystal piezoelectric materials retain their utility and dominate certain special arenas, such as frequency stabilized oscillators, in applications ranging from watches to radar, and surface acoustic wave devices, in applications ranging from television filters to analogue signal correlators, new piezoelectric materials combining a piezoelectric ceramic with a passive polymer have now come to the forefront of the market. Our invention relates to these newer piezoceramic composites and their numerous uses. In particular, our invention contemplates the use of negative Poisson's ratio materials as the passive polymer in the composite structure.

The key consideration in the design; whether for a sensor, an actuator, or both simultaneously; is to ensure the maximum efficiency in electromechanical energy conversion. There are many engineering applications' demands—weight, flexibility, environmental stability, electrical impedance matching, acoustic radiation coupling, cost—that will pull the design away from this optimum, but it is best to aim first at the right target. There are usually many ways to compensate for the piezomaterial's shortfalls in meeting design criteria other than electromechanical energy conversion: acoustic matching layers, electrical transformers, environmental coatings, buoyant ballast. But the piezoelectric material is the only place where electromechanical energy transformation is accomplished. Maximizing the composite's electromechanical coupling should be the first aim in the piezocomposite material design.

Figure 2A:
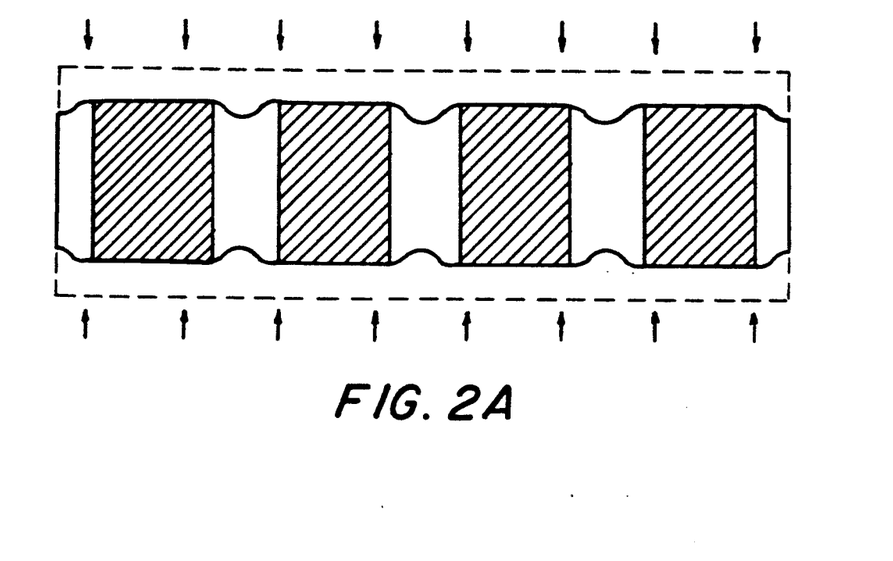
FIG. 2(a) is a schematic side view of a composite plate being squeezed on its faces by a high frequency sound wave.
Figure 2B:
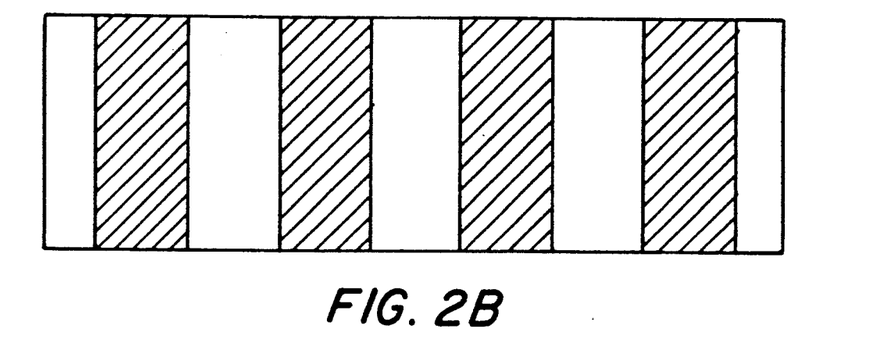
FIG. 2(b) is a schematic side view of the undisturbed plate.
Figure 3:
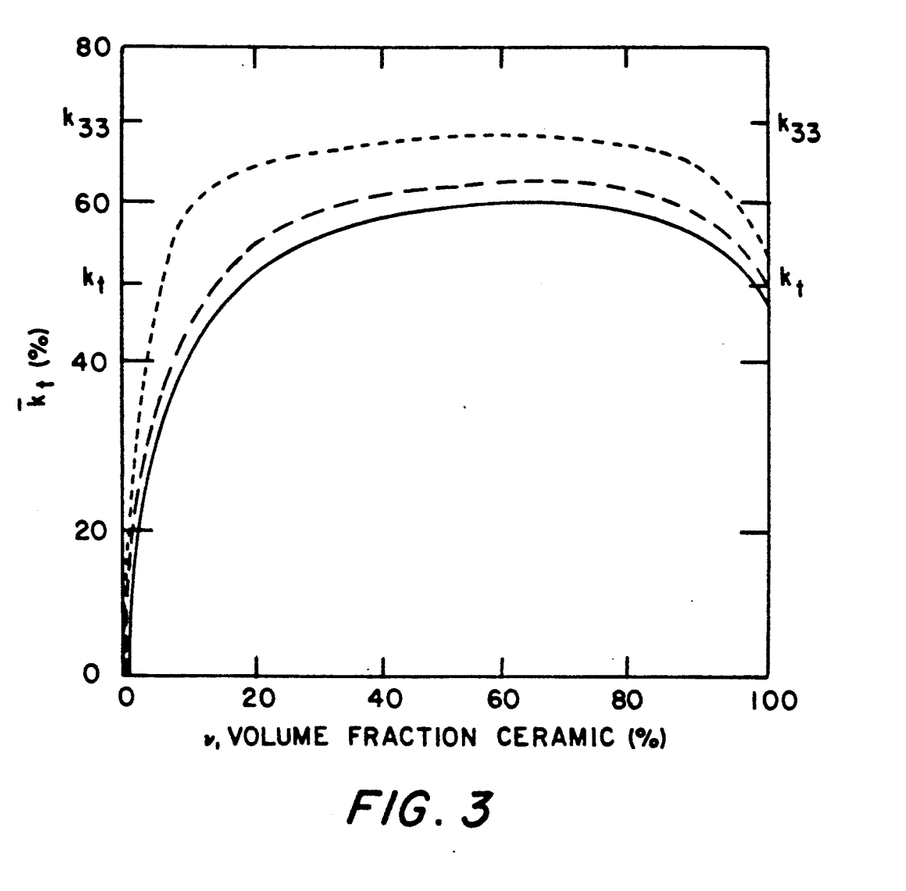
FIG. 3 is a variation of the thickness mode electromechanical coupling constant of a piezocomposite plate with ceramic volume fraction, as predicted from a simple physical model, for three different polymers: stiff (solid), firm (dashed), and soft (dotted).

In pulse-echo applications, a rod composite piezoelectric is more effective at electromechanical energy conversion than is its constituent piezoceramic. While this seems counter-intuitive at first blush, a quick glance at FIG. 2 clarifies the issue. That figure depicts in cross-section the response of a thin composite plate to a high frequency pressure wave impinging on its faces. At the high frequencies employed in pulse-echo applications, the thin plate is so wide that it is inertially clamped as a whole in the lateral directions. That is, the pressure on the faces reverses so fast that the plate does not have time to bulge or contract in the sideways direction. This lateral clamping reduces the total displacement and total piezoelectric charge produced in a solid plate of piezoceramic. In the piezocomposite structure, however, the thin ceramic rods are free to expand or contract in the sideways direction at the expense of the much softer polymer which surrounds them. A piezocomposite plate can have a thickness-mode electromechanical coupling constant (~60-70%), much larger than the thickness-mode coupling of a solid ceramic plate (~45-50%), approaching even the coupling of a long ceramic rod (~70-75%). FIG. 3 shows how the thickness-mode coupling constant for a composite plate varies with volume fraction of piezoceramic for three different polymers. The composite's thickness mode coupling exceeds that of the component ceramic for all but the lowest volume fractions; moreover, a softer polymer permits higher values.

In hydrostatic applications, the effectiveness of a piezoelectric material for electromechanical energy-conversion is measured by the hydrostatic coupling coefficient, $$k_h = d_h/(\epsilon_{33}^T s_h^E)^{\frac{1}{2}}$$

where $d_h$ is the material's hydrostatic current responsivity, $\epsilon_{33}^T$ its dielectric permittivity, and $s_h^E$ the material's hydrostatic compliance.

The hydrostatic current responsivity, $d_h = d_{33} + 2d_{31}$, has two contributions—one from pressure on the faces of the plate, $d_{33}$, and the other from pressure on the sides, $d_{31}$. These two contributions are typically of opposite sign and nearly equal in magnitude. In the piezocomposites, we can increase $d_h$ by reducing the negative lateral contributions.

Figure 4A:
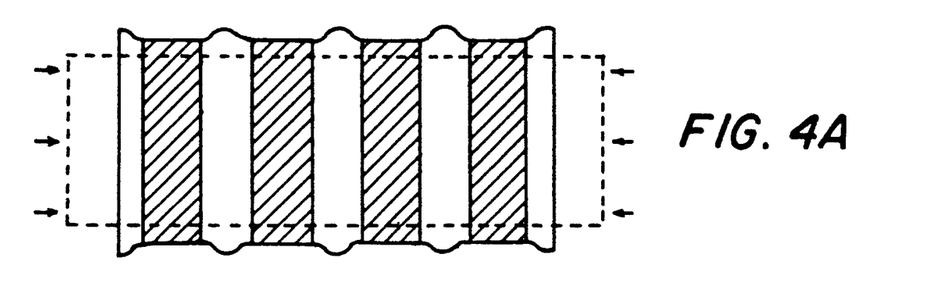
FIGS. 4(a), 4(b), and 4(c) are schematic representations of the physical effects behind the composite piezoelectric charge coefficients.

FIG. 4A depicts the contribution to the hydrostatic current responsivity of the composite from the force exerted on the faces of the plate. The effect is similar to the uniaxial response shown in FIG. 2 above except that, at low frequencies, the entire plate is free to expand laterally. The essential role of the polymer is to transfer the force falling on it to the adjacent ceramic. The $\bar{d}_{33}$ of the composite is nearly equal to the $d_{33}$ of the constituent piezoceramic since nearly all the force falling on the plate is transferred to the ceramic.

Figure 4B:
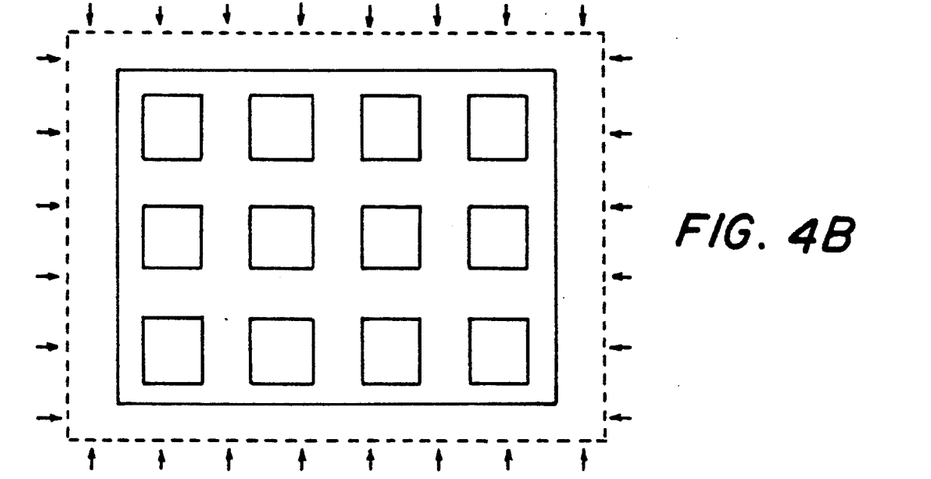

A top view of the composite plate is shown in FIG. 4B which portrays a portion of the contribution to the hydrostatic current responsivity from the force exerted on the sides of the composite plate. Here the polymer transfers part of the lateral force to the ceramic and bears part of the lateral force itself in the regions between the piezoceramic rods. To reduce these negative contributions to the hydrostatic response, we can add reinforcing fibers to these polymer paths so that more of the lateral force is borne by the piezoelectrically passive part of the structure.

Figure 4C:
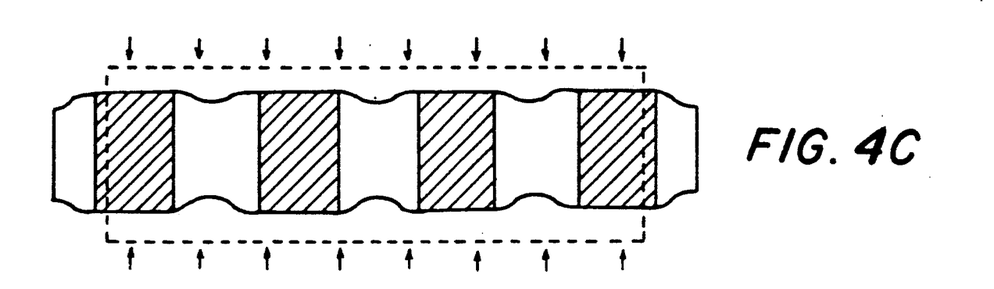

A side view of the composite plate in FIG. 4C which shows the remaining portion of the contribution to the hydrostatic current responsivity from the force exerted on the sides of the composite plate. Here the polymer both presses on the sides of the ceramic rods as well as bulges up. The direct pressure on the sides of the ceramic was accounted for above. The bulging of the polymer, however, is a new effect. This bulging causes the polymer to pull on the ceramic rods trying to lengthen them, thereby producing a contribution to the $\bar{d}_{31}$ of the composite from the $d_{33}$ of the ceramic. This Poisson-ratio effect is an important contribution to the composite's $\bar{d}_{31}$. To minimize this contribution to the composite's $\bar{d}_{31}$ we can reduce the polymer's Poisson ratio by adding air bubbles. Foaming the polymer is an effective strategy for reducing these deleterious contributions to the hydrostatic response, but unfortunately introduces an unwanted pressure dependence because these air pockets can collapse under high static bias pressures.

Figures 5A, 5B:
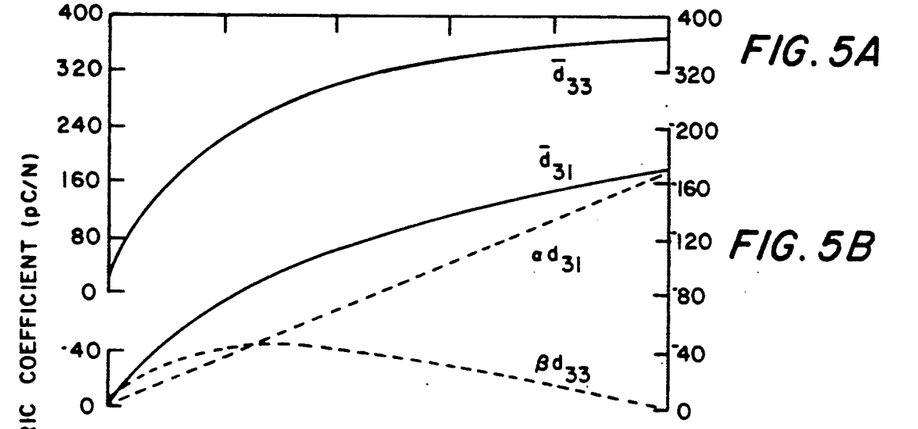
FIG. 5(a), 5(b), and 5(c) show the piezoelectric charge coefficients for a composite made from conventional PZT 5 and Stycast, a firm polymer.

FIG. 5A shows that the $\bar{d}_{33}$ coefficient rises monotonically with ceramic fraction: as the amount of ceramic increases, more of the force on the faces of the plate is borne by the piezoelectrically active ceramic and less by the passive polymer. Since ceramics are typically an order of magnitude stiffer than the polymer, the composite's $\bar{d}_{33}$ attains almost the value of the ceramic's $d_{33}$ already at low ceramic fraction. At low ceramic content, the more stiff the ceramic, the greater fraction of the force on the ceramic. At moderate ceramic content, the shifting of the load from the polymer to the ceramic saturates and little more remains to be gained since once the ceramic is carrying most of the external force, it can do no more.

The curves of FIG. 5B show the variation of the composite's $\bar{d}_{31}$ coefficient in the solid curve, as well as, in the dotted curves, the two contributions that sum up to it, namely, $\bar{d}_{31} = \alpha d_{31} + \beta d_{33}$, where the $\alpha d_{31}$ term is the contribution from the ceramic's $d_{31}$, and $\beta d_{33}$ term contains the contribution from the ceramic's $d_{33}$. The enhancement of the composite's $\bar{d}_{31}$ by the $\beta d_{33}$ term is deleterious. It stems from the stress on the composite's sides causing the more compliant polymer to bulge vertically more than the ceramic; the bulging polymer acts to extend the rods, producing a charge directly from the ceramic's $d_{33}$.

Figure 5C:
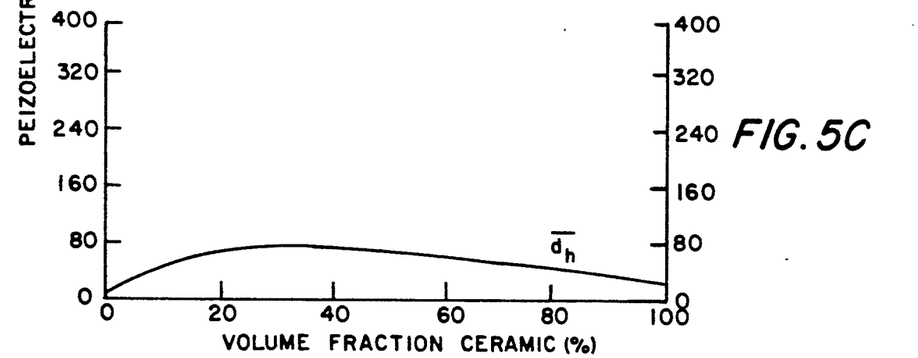
Figure 6A:
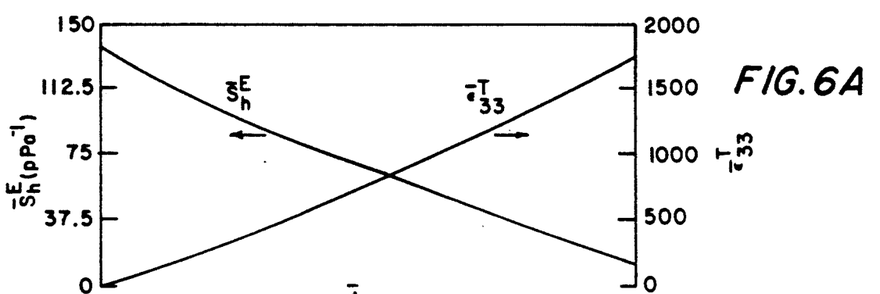
FIGS. 6(a), 6(b), 6(c), and 6(d) show the variation of dielectric and elastic coefficient with the volume fraction of ceramic in percent.
Figure 6B:
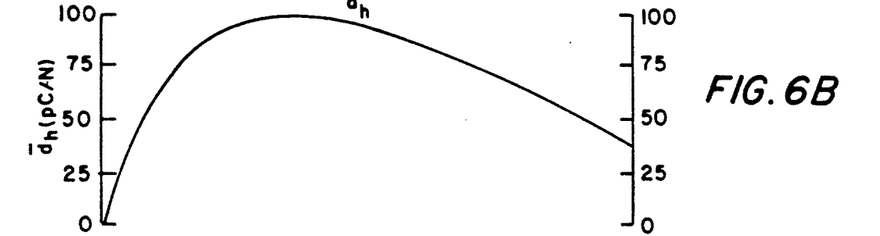
Figure 6C:
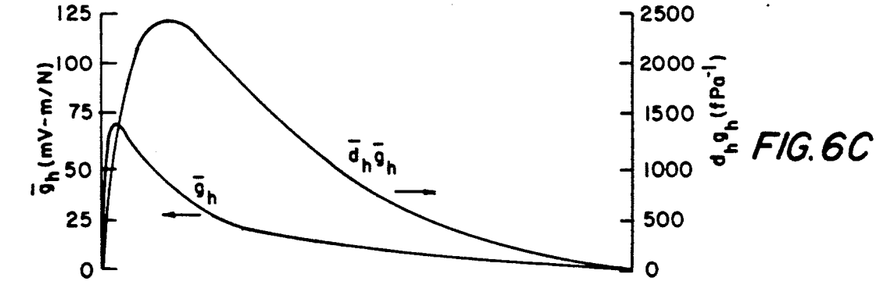
Figure 6D:
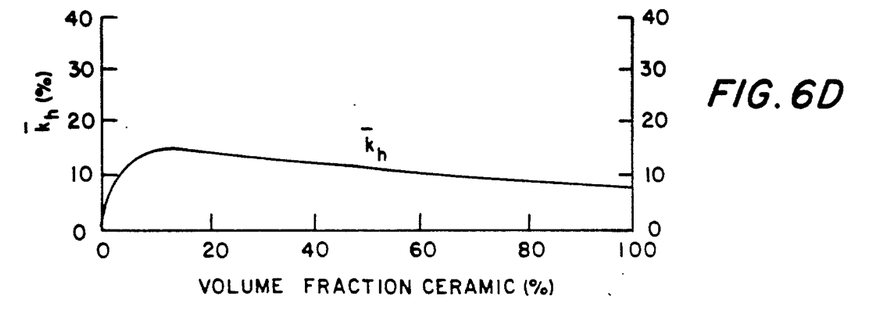

The curve in FIG. 5C shows the composite's hydrostatic charge response, $\bar{d}_h = \bar{d}_{33} + 2\bar{d}_{33}$, which is just the sum of the two previously described curves. The composite structure enhances $\bar{d}_h$ over the ceramic's $d_h$ at low volume fraction.

While the piezoelectric coefficient—discussed above—is central to the use of piezocomposites as hydrostatic transducer materials, other properties of the material are important in determining their suitability for devices, in particular their dielectric and elastic coefficients. FIG. 6 shows the variation with ceramic fraction of the dielectric permittivity, $\epsilon_{33}^T$, and the hydrostatic compliance, $S_h^E$. Both of these properties interpolate nearly linearly between the values for the pure polymer and pure ceramic. In the case of the dielectric constant, the slight suppression at low ceramic fraction is due to partial mechanical clamping of the ceramic by the softer—but greater in amount—polymer. In the elastic arena, a modest curvature occurs at low ceramic fraction; this stems from the effectiveness of small amounts of ceramic in stiffening the composite plate in the direction along the rods. Combining the previously calculated hydrostatic charge coefficient, dhd h, with these elastic and dielectric responses yields the hydrostatic electromechanical coupling constant which reveals the advantage of the composite structure, namely, the composite's $\bar{k}_h$ exceeds the ceramic's $k_h$.

Description of the Related Art

Designing new piezoelectric materials by combining a piezoelectric ceramic with a passive polymer has been a research theme now for more than a decade. The publication of R. R. Gururaja et al is a thorough review of the state of the art of ceramic polymer composites up to 1987. U.S. Pat. No. 4,728,845 to HAUN et al discloses the use of a piezoelectric composite consisting of lead zirconate-titanate (PZT) and a polymer for use in hydrophones. HAUN enhances the piezoelectric charge and voltage coefficients by using a void to isolate PZT rods from the polymer.

The publication of Smith Role of Piezocomposites in Ultrasonic Transducers, Proceeding of IEEE, 1989 discloses the use of piezoceramic and passive polymers in ultrasonic medical imagers. The U.S. Pat. No. 4,613,784 to HAUN et al also is concerned with enhancing the hydrostatic piezoelectric voltage coefficient of a PZT-polymer composite. In this patent, transversly reinforced glass fibers are used to achieve the enhanced coefficient. The first publication of K. E. Evans "Tensile Network Microstructures Exhibiting Negative Poisson's Ratio", J. Phys. D:APPL./PHYS. 22 1989.

On page 1875 of this publication Evans discloses that his previously described tensile microstructures can be found in polymers details various microstructures which can exhibit a negative Poisson ratio. The second K. E. Evans "Tailoring the Negative Poisson Ratio", Chemistry and Industry, Oct. 1990. In this reference on page 656, polytetrafluorothylene (PTFE) is disclosed as exhibiting a large negative Poisson ratio. On the same page, reference is made to ultra-high molecular weight polyethylene and other polymers publication explores the tailoring of the negative Poisson ratio material. Our invention utilizes a negative Poisson ratio material for its improved performance characteristics. The U.S. Pat. No. 4,668,557 to Roderic Lakes describes a method of making negative Poisson Ratio materials.

SUMMARY OF THE INVENTION

This invention is intended to maximize the electromechanical coupling in 1-3 piezocomposites by using materials for the passive polymer phase that possesses negative Poisson's ratio. The negative Poisson's ratio materials are used to redirect external stress to bear on the piezoceramic material. An object of the invention is to enhance substantially the electromechanical coupling coefficient for both thickness-mode and hydrostatic mode in 1-3 composite piezoelectric materials. Using the improved materials in pulse-echo transducers used in resonant thickness-mode will lead to increased transducer bandwidth, lower insertion loss, and more compact impulse response—all critical measures of the transducer's performance and utility. Using the improved materials in hydrophone sensors or hydrostatic actuators used in non-resonant thickness-mode will lead to increased sensitivity as a receiver and increased efficiency as an actuator—critical performance characteristics for naval sonal transducers. Moreover, these improved hydrostatic performance characteristics will be stable under hydrostatic bias pressure encountered by naval transducers opiating at great depths in the ocean.

DESCRIPTION OF THE PREFERRED EMBODIMENT

Figure 1:
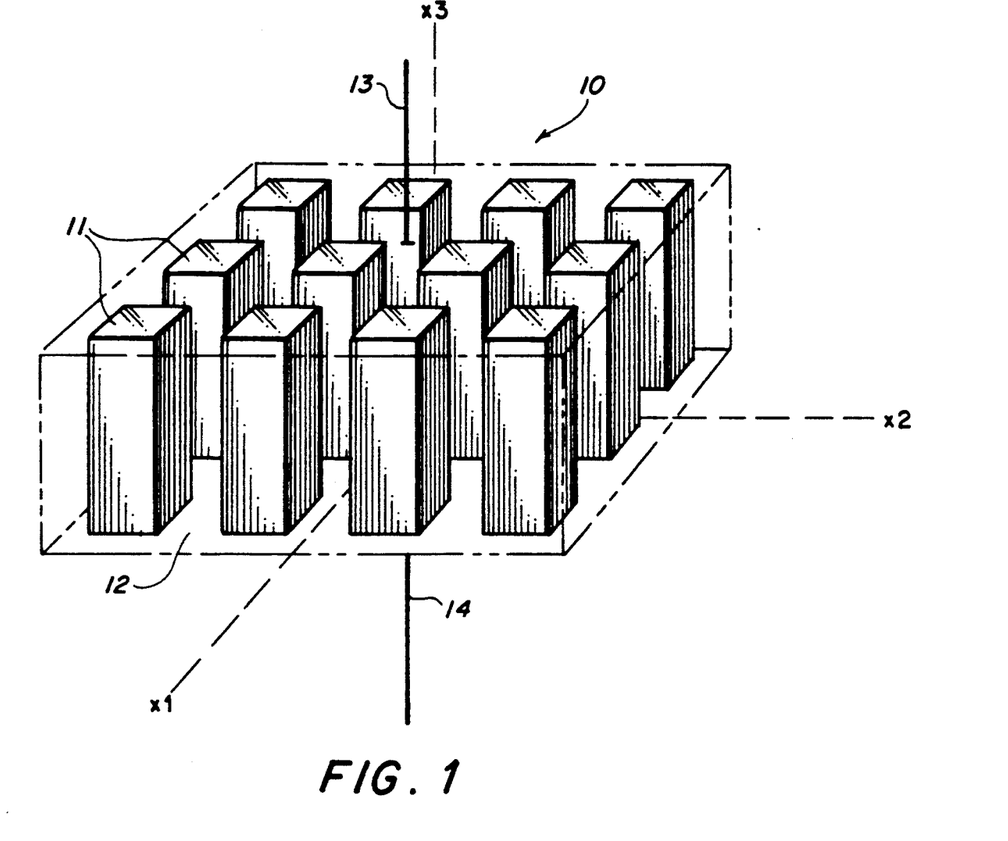
FIG. 1 illustrates the rod composite or 1-3 composite-geometry that is contemplated for the invention.

Referring to FIG. 1, a piece 10 of composite PZT-polymer is shown which consists of ceramic rods 11 imbedded in a polymer matrix 12. Orthogonal axes $X_1$, $X_2$ and $X_3$ are shown as a reference for direction and to aid in describing a connectivity pattern. In our notation of 1-3, for example, one (1) refers to the one dimensionally connected PZT phase and three (3) refers to the three dimensionally connected polymer phase. Connected to the composite piece are electrodes 13 and 14.

Although our preferred embodiment utilizes PZT, it should be understood that the principle of the invention could utilize any piezoelectric ceramic material, i.e., PZT5 which is $Pb(Zi,Ti)O_3$. Similarly, the polymer could be one of many materials, i.e., PFE or polyurethane as discussed in the Evans publications "Tailring the Negative Poisson Ratio" or an epoxy as disclosed in the Haun, et al. patent.

The most widely used method to make 1-3 piezocomposites is the dice-and-fill technique. With this method, two sets of deep grooves are cut in a block of piezoceramic at right angles to each other, a polymer is cast into these grooves, and the solid ceramic base is ground off. After polishing the plate to final thickness, electrodes are applied to the faces, and the ceramic is poled by applying a strong electric field, usually at slightly elevated temperatures. For high-frequency operation, fine spatial scales are required; this presents severe demands on the machinability of the ceramic as well as on the machining technology itself. Kerfs of 25 microns and below are achievable, using diamond impregnated dicing wheels on OD saws developed for the semiconductor industry to dice chips from a processed silicon wafer. A fine-grained, high-density piezoceramic is essential if the pillars are to survive this machining.

The above dice-and-fill technique can be varied so that the need for polishing to final thickness is eliminated. This variation proceeds in two steps: first, in a solid ceramic plate of desired thickness, two sets of grooves at right angles to each other are cut halfway through, and a polymer is vacuum cast into the grooves with a lid waxed onto the top of the ceramic to prevent any polymer from coating the tops of the pillars. Second, the plate is turned over and the process is repeated with the new grooves aligned with the already filled grooves in the lower half. After the second polymer fill, the capping lids are removed, the plate is electroded and poled. The final composite thickness is set by the initial thickness of the solid ceramic plate; no polishing is necessary. Grooves only half the desired composite thickness are cut; finer scales can be made with less risk of pillar fracture.

A third method of making our invention which can be used if round bars are desired is described in the HAUN, et al U.S. Pat. No. 4,728,845, Col 2, line 62 to Col 3, line 2 which is hereby incorporated by reference.

The invention maximizes the electromechanical coupling in the 1—3 piezocomposites by using materials for the passive polymer phase that possess negative Poisson's ratio. To understand how this is achieved, it is useful to review the status of research on materials with negative Poisson's ratio.

If we press on the top and bottom of a piece of material, it not only gets shorter, but also, typically, bulges out to its sides. This lateral bulging is known as the Poisson effect, and is characterized by the Poisson ratio, defined as minus the lateral strain divided by the longitudinal strain. The minus sign is introduced so that positive values are obtained; this minus sign incorporates our normal experience that when you squeeze something it contracts along the direction where pressure is applied but expands in the perpendicular directions. In terms of the elastic compliance, $s_{ij}$, of an isotropic material, Poisson's ratio, $\sigma$, is just $-s_{12}/s_{11}$. This ratio cannot take on just any value. If the solid is in a stable equilibrium state, the elastic compliance must be a positive definite matrix; this constrains the Poisson's ratio of an isotropic medium to lie between $-1$ and $+\frac{1}{2}$. There is no physical requirement that Poisson's ratio be positive. The fact that most materials have positive Poisson's ratio, typically near 0.3, is an accidental occurrence, not a logical necessity.

Materials exhibiting negative Poisson's ratio occur naturally, but only rarely. The recent swell of interest in these materials stems from the fact that they can be crafted by tailoring a material's microstructure. To make a material of this type, a polymer foam is isotropically crushed by a substantial amount, i.e., factor of two or three in volume and then annealed to retain the deformed state as its new equilibrium. This new isotropic material with a reentrant foam microstructure has the desired property of a negative Poisson's ratio. A more complete discussion of a method of making negative Poisson Ratio materials is described in the U.S. Pat. No. 4,668,557 issued to Roderic Lakes which is herein incorporated by reference in this application.

The projected improvements in piezocomposite performance can be realized in a variety of ways. A negative Poisson's ratio material might be synthesized separately, ground up, and inserted as a filler in a normal polymer used in the conventional dice-and-fill fabrication method. Alternately, the material might be made in ribbon or fiber form, interspersed with piezoelectric fibers, and finally fused into a bundle which can be sliced into the desired plate form. The most effective embodiment of this idea requires negative Poisson's ratio materials with high elastic modulus.

A critical restriction is that the lateral rod spacing in the composite be sufficiently fine that any direct vertical stress impinging on the polymer be effectively transferred laterally to the piezoceramic rod. If this is the case, the piezocomposite plate oscillates uniformly across its face and the composite acts as an effective homogeneous medium. This is a restriction on material performance. If the spacings are too coarse, the acoustic energy incident on the polymer portion of the transducer is lost and transducer performance suffers—even if we could devise a simple and effective model for its performance. The safe range of spacings depends, in first order, on the shear modulus of the polymer phase. If the polymer's shear modulus is high, stresses pressing on the polymer in the face of the transducer are readily transferred laterally to the ceramic rods which convert that acoustic energy into electrical form; then, relatively wide spacing of the rods is permitted. Conversely if the polymer is soft under shear, the rods must be closely spaced, placing substantial demands—both in technologky and in cost—on the material fabrication.

In 1-3 piezocomposite plates being optimized for the thickness-mode resonance used in pulse-echo imaging transducers, the polymer phase plays another important role: being softer than the piezoceramic, the polymer allows the rods to laterally bulge or contract while the composite plate as a whole remains inertially clamped in the lateral direction. This means that the external stresses tap into the larger (typically 70-75%) rod—or laterally free—electromechanical coupling factor, $k_{33}$, rather than the small (typically 45-50%) plate—or laterally clamped—coupling factor of the piezoceramic. Of course, a normal polymer will always provide some partial lateral clamping, so the maximum electromechanical coupling of the ceramic's $k_{33}$ is not attained by the composite plate.

Figure 8:
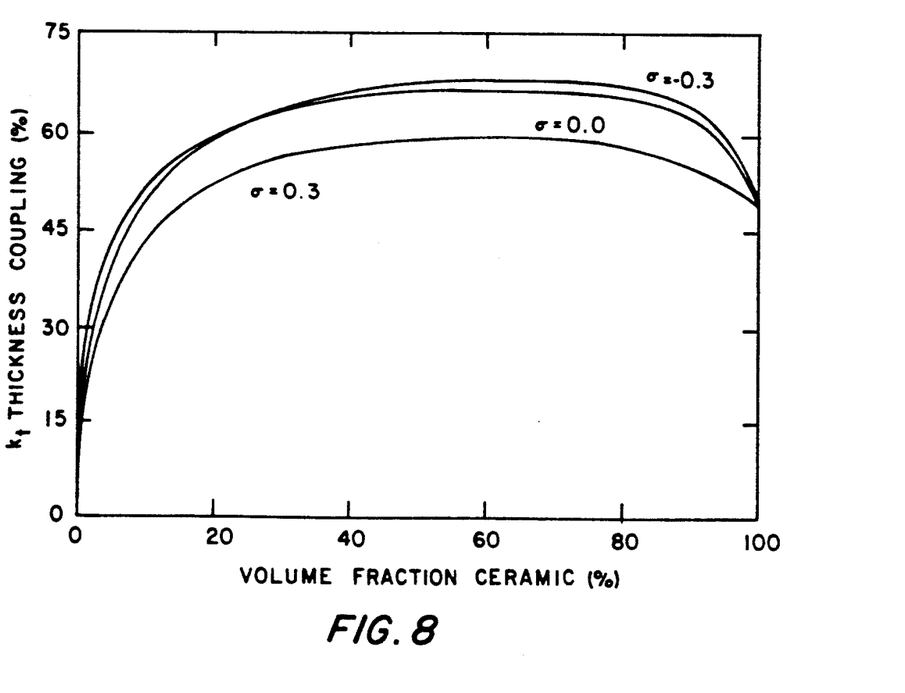
FIG. 8 shows the calculated values of $K_t$ versus ceramic fraction for three different Poisson Ratios.

The newly devised polymers with negative Poisson's ratio enable us to lessen or even totally escape this constraint. When a sound wave presses on the top of a composite plate containing a polymer with negative Poisson's ratio, the polymer will shorten and pull in laterally. This lateral contraction of the polymer not only lets the ceramic expand freely but also—if we could design the right polymer—pulls out on the sides of the ceramic rods. This way we might achieve the stress pattern on the ceramic that provides its maximal coupling constant $k_{t3}$. FIG. 8 plots the calculated values of $k_t$ versus ceramic fraction for selected values of the Poisson's ratio ranging from a typical normal value of $+0.3$ to the opposite of $-0.3$. The negative Poisson's ratio provides clear advantages.

Another benefit is provided by a polymer with negative Poisson's ratio: its shear modulus, $c_{44}=[2s_{11}(1+\sigma)]^{-1}$, is larger. Thus, for a polymer with a given compliance, $s_{11}$, the negative $\sigma$ would permit a wider spacing of rods, lessening demands on material fabrication. Not all problems are solved however, Even with a negative Poisson's ratio, the polymer will still have a finite elastic modulus and will consume energy to compress. This effect dominates, of course, at low volume fractions of ceramic, as we see in FIG. 8.

Designing a 1-3 piezocomposite plate to respond to a hydrostatic stress is a daunting task because the hydrostatic stress pattern has very nearly zero coupling in the best piezoceramic, lead zirconate-titanate. Indeed, modified lead titanates are often preferred in this application in spite of their considerably lower maximal coupling coefficient $k_{t3}$ (50-55% versus 70-75% in PZT) and dielectric constant (200-500 versus 1000-6500 in PZT).

Figure 7:
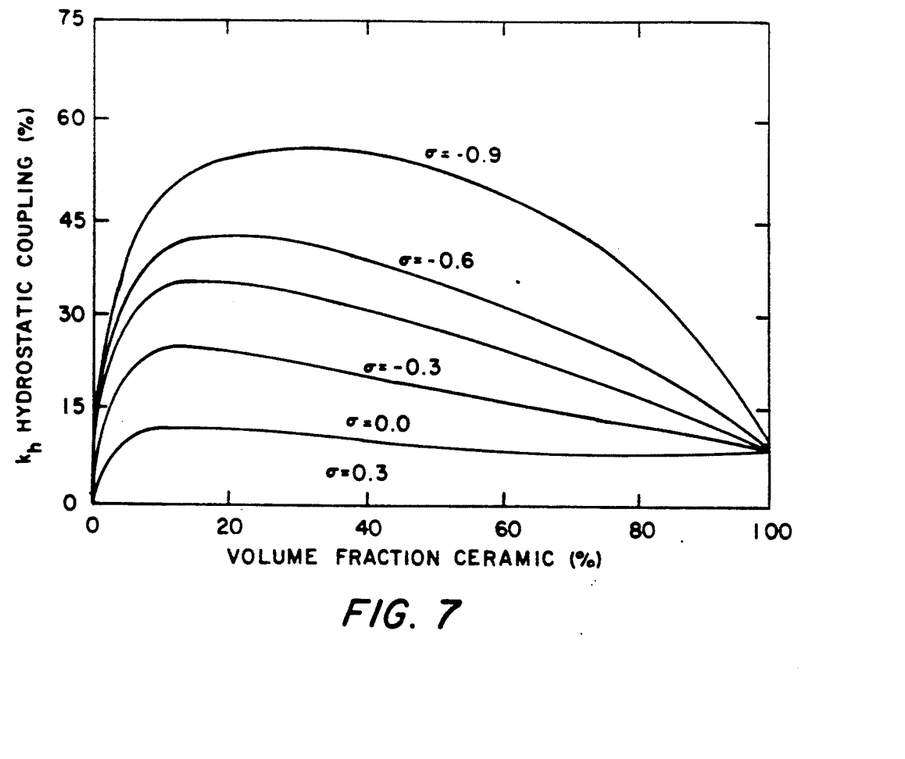
FIG. 7 depicts the hydrostatic coupling factor versus the volume fraction of piezoelectric ceramic for various Poisson's ratios.

In this application, not only is the incident isotropic planar stress transmitted directly to the rods, but also the Poisson effect in the polymer phase converts the planar stress to a vertical stress which opposes the incident vertical stress. This, of course, occurs with a normal polymer with positive Poisson's ratio. So, the new negative Poisson's ratio materials have a useful role to play here too. By converting a planar compressive stress into a vertical compressive stress, such new polymers redirect energy to reinforce the vertical compressive stress not oppose it. FIG. 7 shows the enhancements in hydrostatic coupling constant that can be achieved using polymers with negative Poisson's ratio.

The need to suppress the polymer's Poisson effect for the hydrophone application has been understood for some time. The two HAUN, et al patents disclose two methods of accomplishing this by introducing a void into the polymer to reduce $\sigma$; this introduces an undesired bias pressure dependence to the hydrophone sensitivity which can be addressed by introducing horizontal stiffening fibers. An adequately stiff material with negative Poisson's ratio is a simpler solution.

What is claimed is:

1. A piezoelectric ceramic-polymer composite material comprising: a matrix of a polymer which has a negative Poisson ratio, a plurality of piezoelectric ceramic rods embedded in said matrix each of which rods has its longitudinal axis aligned in the same direction; and means for polarizing the composite with an electric field parallel to the axis of said rods.

2. The composite of claim 1 in which the connectivity between materials is 1-3.

3. The composite of claim 2 in which the piezoelectric ceramic is a niobium doped PZT material.

4. The composite of claim 3 in which the said polymer is an epoxy.

5. The composite of claim 4 further including electrodes connected on opposite sides of said composite so that the composite can be used as a transducer for a hydrophone.

6. The composite of claim 4 further including electrodes connected on opposite sides of said composite so that the composite can be used as an ultrasonic transducer.

7. A piezoelectric ceramic-polymer composite material of 1-3 connectivity for use as a transducer comprising: a passive polymer matrix which exhibits a negative Poisson ratio, a plurality of PZT piezoelectric rods embedded in said matrix, each of said rods having its longitudinal axis aligned in the same direction; and means for polarizing the composite with an electric field parallel to the axis of said rods.

* * * * *